US006867477B2

(12) United States Patent
Zheng et al.

(10) Patent No.: US 6,867,477 B2
(45) Date of Patent: Mar. 15, 2005

(54) HIGH GAIN BIPOLAR TRANSISTOR

(75) Inventors: Jie Zheng, Lake Forest, CA (US); Peihua Ye, Tustin, CA (US); Marco Racanelli, Santa Ana, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/290,975

(22) Filed: Nov. 7, 2002

(65) Prior Publication Data

US 2004/0089877 A1 May 13, 2004

(51) Int. Cl.$^7$ ............... H01L 29/00; H01L 27/102; H01L 29/70; H01L 31/11; H01L 27/082
(52) U.S. Cl. ............ 257/557; 257/561; 257/575; 257/591; 257/592; 257/593
(58) Field of Search ............... 257/561, 575, 257/591, 592, 593, 557, 571, 578, 579, 587, 588, 562, 563

(56) References Cited

U.S. PATENT DOCUMENTS

| | | | | |
|---|---|---|---|---|
| 5,510,647 A | * | 4/1996 | Nakajima et al. ......... | 257/559 |
| 5,654,211 A | * | 8/1997 | Ham ........................ | 438/367 |
| 5,698,890 A | * | 12/1997 | Sato ........................ | 257/592 |
| 5,786,622 A | * | 7/1998 | Ronkainen ................ | 257/578 |
| 5,789,800 A | * | 8/1998 | Kohno ...................... | 257/588 |
| 6,255,716 B1 | * | 7/2001 | Jeon ......................... | 257/587 |

\* cited by examiner

*Primary Examiner*—Eddie Lee
*Assistant Examiner*—Samuel A Gebremariam
(74) *Attorney, Agent, or Firm*—Farjami & Farjami LLP

(57) ABSTRACT

According to one exemplary embodiment, a bipolar transistor comprises a base having a top surface. The bipolar transistor might be a lateral PNP bipolar transistor and the base may comprise, for example, N type single crystal silicon. The bipolar transistor further comprises an emitter having a top surface, where the emitter is situated on the top surface of the base. The emitter may comprise P+ type single crystal silicon-germanium, for example. The bipolar transistor further comprises an electron barrier layer situated directly on the top surface of the emitter. The electron barrier layer will cause an increase in the gain, or beta, of the bipolar transistor. The electron barrier layer may be a dielectric such as, for example, silicon oxide. In another embodiment, a floating N+ region, instead of the electron barrier layer, is utilized to increase the gain of the bipolar transistor.

15 Claims, 4 Drawing Sheets

HIGH GAIN BIPOLAR TRANSISTOR

BACKGROUND OF THE INVENTION

1. Field of the Invention

The present invention generally relates to the field of fabrication of semiconductor devices. More particularly, the present invention relates to the field of fabrication of bipolar transistors.

2. Related Art

In addition to high speed, low noise, and high current driver advantages of bipolar transistors, circuits used in modern electronic devices also require low power consumption and high process integration typically provided by metal-oxide semiconductor ("MOS") transistors. In an attempt to combine the benefits of NPN and PNP bipolar transistors with the benefits of MOS transistors, such as P and N channel field effect transistors, semiconductor manufacturers fabricate circuits comprising bipolar and MOS transistors on the same substrate of a die using Bipolar Complementary-Metal-Oxide-Semiconductor ("BiCMOS") technology.

To reduce manufacturing cost, semiconductor manufacturers commonly form lateral PNP transistors such that they are compatible with process flows adapted to fabricate NPN devices or MOS devices. For example, a base of a lateral PNP transistor can be formed utilizing a thin epitaxial N layer that is also utilized to form a collector of an NPN transistor. However, the thin epitaxial layer utilized in the fabrication of a collector of a high performance NPN transistor results in a lateral PNP transistor having an unacceptable gain when the thin epitaxial layer is also utilized to form the base of the lateral PNP transistor. Thus, semiconductor manufacturers are challenged to provide a lateral PNP transistor having an acceptable gain such that the fabrication of the lateral PNP transistor is compatible with the process flow utilized to fabricate an NPN transistor.

FIG. 1 shows a cross-sectional view of a structure that includes a conventional exemplary lateral PNP transistor formed in a manner compatible with a process flow utilized to fabricate an NPN and MOS devices. Structure 100 includes conventional lateral PNP transistor 102, substrate 104, buried layer 106, and silicide layer 108. Conventional lateral PNP transistor 102 includes base 110, emitter 112, and collectors 114 and 116.

As shown in FIG. 1, buried layer 106 comprises N+ type material and is formed in substrate 104 in a manner known in the art. Also shown in FIG. 1, base 110 is situated over buried layer 106 and can be, for example, N type single crystal silicon that may be formed using a dopant diffusion process in a manner known in the art. Emitter 112 is situated over base 110 and may comprise a P+ type material such as P+ type silicon-germanium ("SiGe"), which may be deposited epitaxially in a low-pressure chemical vapor deposition ("LPCVD") process. Further shown in FIG. 1, silicide layer 108 is situated over emitter 112 and provides an ohmic contact for emitter 112 as known in the art. Also shown in FIG. 1, collectors 114 and 116 are formed in substrate 104 in a manner known in the art and can comprise P type material.

The operation of conventional exemplary lateral PNP transistor 102 will now be discussed. When base-emitter junction 118 is forward biased in an active mode of operation, the beta, i.e. the gain, of conventional exemplary lateral PNP transistor 102 is inversely proportional to base current at constant collector current. Thus, at constant collector current, a decrease in base current will cause the beta to increase. By way of background, base current in a bipolar transistor comprises two dominant components: a space charge recombination current that occurs at depletion region of the base-emitter junction and a diffusion current that is caused by an electron concentration gradient in the emitter of the bipolar transistor.

In the active mode, a high electron concentration exists at the edge of emitter side of base-emitter junction 118 of conventional lateral PNP transistor 102 as a result of forward bias at base-emitter junction 118, among other things. However, at the interface between silicide layer 108 and emitter 112, i.e. interface 120, the electron concentration is approximately zero as a result of the ohmic contact formed by silicide layer 108. Thus, an electron concentration gradient is formed as a result of high electron concentration at base-emitter junction 118 and approximately zero electron concentration at interface 120. The resulting higher electron concentration gradient causes higher electron diffusion current to flow in emitter 112, which increases base current. An increase in base current results in an undesirable decrease in gain, or beta, of conventional exemplary lateral PNP transistor 102, since the gain of lateral PNP transistor 102 is inversely proportional to base current as discussed above. The amount of electron diffusion current flow, and thus the amount of increase in base current, is determined by the steepness of the electron concentration gradient. An increase in steepness of the electron concentration gradient, for example, causes an increase in electron diffusion current.

One approach utilized to increase the gain of a lateral PNP transistor, such as conventional exemplary lateral PNP transistor 102, is to fabricate a thin oxide layer over emitter 112 and then fabricate a polysilicon layer between the thin oxide layer and silicide layer 108. The thin oxide layer functions as an electron barrier that causes an increase in electron concentration at the interface between emitter 112 and the thin oxide layer, which results in a decrease in the steepness of the electron concentration gradient in emitter 112. As a result, base current decreases, which causes the gain of exemplary lateral PNP transistor 102 to increase. However, the above approach results in an undesirable increase in process steps and fabrication cost associated with forming both the thin oxide layer and the polysilicon layer.

Thus, there is a need in the art for a bipolar transistor, such as a lateral PNP bipolar transistor, to have an increased gain without suffering an undesirable increase in process steps and fabrication cost.

SUMMARY OF THE INVENTION

The present invention is directed to a high gain bipolar transistor. The present invention addresses and resolves the need in the art for a bipolar transistor, such as a lateral PNP bipolar transistor, to have an increased gain without suffering an undesirable increase in process steps and fabrication cost.

According to one exemplary embodiment, a bipolar transistor comprises a base having a top surface. The bipolar transistor might be, for example, a lateral PNP bipolar transistor and the base may comprise, for example, N type single crystal silicon. The bipolar transistor further comprises an emitter having a top surface, where the emitter is situated on the top surface of the base. The emitter may comprise P+ type single crystal silicon-germanium, for example. The bipolar transistor further comprises an electron barrier layer situated directly on the top surface of the emitter, where the electron barrier layer causes the base current in said base to decrease. The electron barrier layer will thus cause an increase in the gain, or beta, of the bipolar transistor. The electron barrier layer may be a dielectric such as, for example, silicon oxide.

In another embodiment, a floating N+ region, instead of the electron barrier layer, is utilized to increase the gain of the bipolar transistor. Other features and advantages of the present invention will become more readily apparent to those of ordinary skill in the art after reviewing the following detailed description and accompanying drawings.

DETAILED DESCRIPTION OF THE INVENTION

The present invention is directed to a high gain bipolar transistor. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 2:
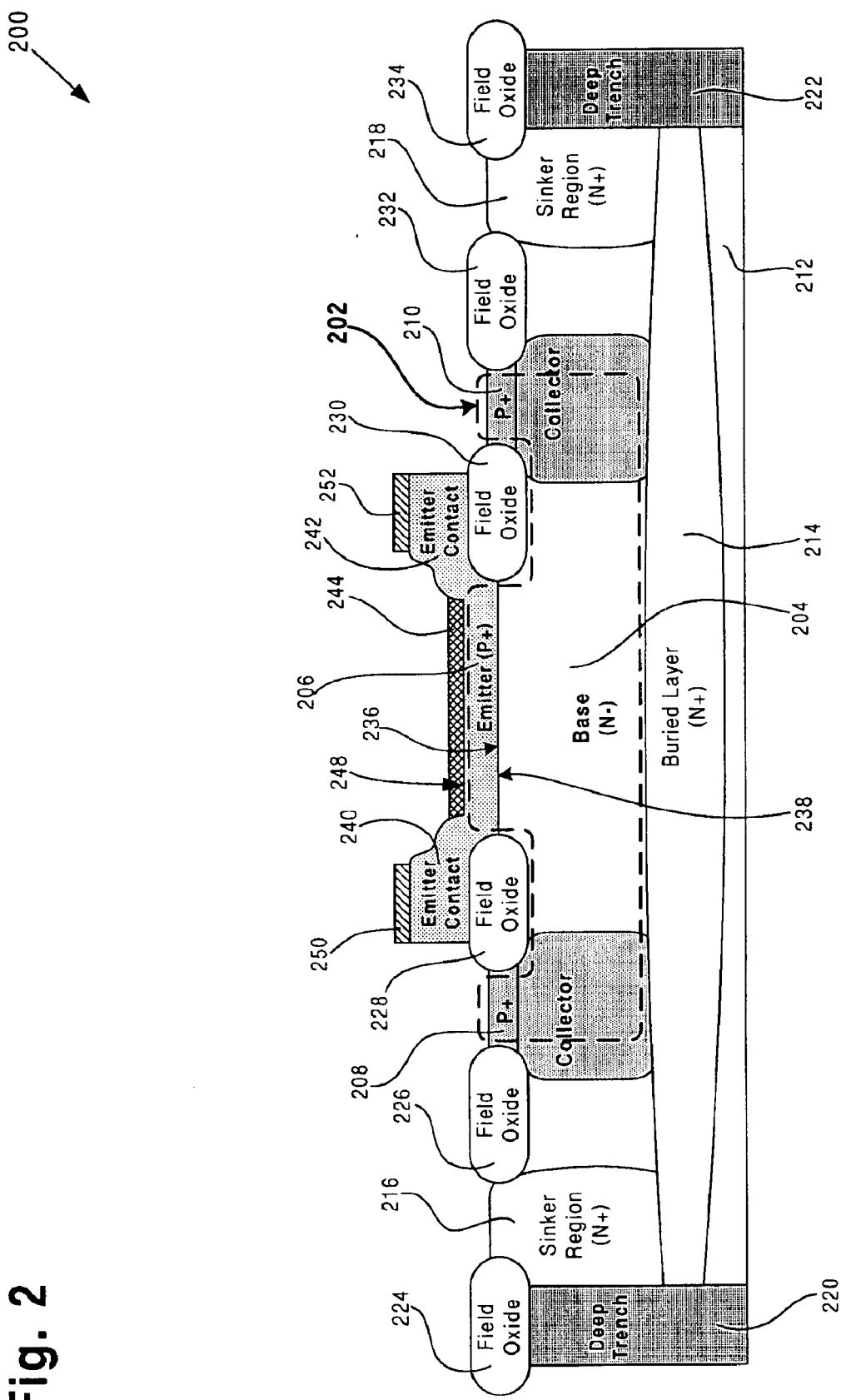
FIG. 2 illustrates a cross-sectional view of an exemplary structure utilized in the fabrication of an exemplary bipolar transistor in accordance with one embodiment of the present invention.

FIG. 2 shows a cross-sectional view of an exemplary structure that includes an exemplary lateral PNP transistor in accordance with one embodiment of the present invention. Certain details and features have been left out of FIG. 2 that are apparent to a person of ordinary skill in the art. As shown in FIG. 2, structure 200 includes lateral PNP transistor 202, which includes base 204, emitter 206, and collectors 208 and 210. The present invention applies, in general, to any lateral PNP transistor, including a PNP heterojunction bipolar transistor ("HBT"). For example, the present invention applies to lateral PNP HBTs comprising silicon, silicon-germanium, silicon-germanium-carbon, gallium-arsenide, or other materials. However, the present application makes specific reference to a lateral silicon-germanium ("SiGe") PNP bipolar transistor as an aid to describe an embodiment of the present invention.

Also shown in FIG. 2, buried layer 214, which comprises N+ type material, i.e. it is relatively heavily doped N type material, is formed in substrate 212 in a manner known in the art. Further shown in FIG. 2, sinker regions 216 and 218, which also comprise of N+ type material, can be formed by diffusion of heavily concentrated dopants form the surface of sinker regions 216 and 218 down to buried layer 214. Buried layer 214, along with sinker regions 216 and 218, provide low resistance electrical pathways from base 204 through buried layer 214 and sinker regions 216 and 218 to base contacts (the base contacts are not shown in FIG. 2).

Also shown in FIG. 2, deep trenches 220 and 222 and field oxide regions 224, 226, 228, 230, 232, and 234 may be composed of silicon dioxide and are formed in a manner known in the art. Deep trenches 220 and 222 and field oxide regions 224, 226, 228, 230, 232, and 234 provide electrical isolation from other devices on substrate 212 in a manner known in the art. Although field oxide regions 224, 226, 228, 230, 232, and 234 comprise silicon dioxide in the present embodiment, a person skilled in the art will recognize that other materials may be used, such as silicon nitride, a low-k dielectric, or other suitable dielectric material. Field oxide regions 224, 226, 228, 230, 232, and 234 can also be other forms of isolation, such as shallow trench isolation oxide ("STI"), formed in a manner known in the art.

Further shown in FIG. 2, base 204 is situated above buried layer 214. In the present embodiment, base 204 can comprise N type single crystal silicon, which may be epitaxially deposited using a reduced pressure chemical vapor deposition ("RPCVD"), an LPCVD, or a chemical vapor deposition ("CVD") process. Also shown in FIG. 2, emitter 206 is situated on top surface 236 of base 204. In the present embodiment, emitter 206 can comprise P+ type single crystal SiGe, which may be epitaxially deposited using an RPCVD, LPCVD, or CVD process. Base-emitter junction 238 is formed at the interface between base 204 and emitter 206.

Also shown in FIG. 2, emitter contact layers 240 and 242 are situated over field oxide regions 228 and 230, respectively, and provide low resistance connections to emitter 206. Emitter contact layers 240 and 242 may comprise polycrystalline SiGe, which may be epitaxially deposited in an LPCVD or RPCVD process. Further shown in FIG. 2, electron barrier layer 244 is situated on top surface 248 of emitter 206. In the present embodiment, electron barrier layer 244 can comprise silicon oxide or other dielectric and may be deposited on top surface 248 of emitter 206 utilizing an LPCVD or RPCVD process. In one embodiment, electron barrier layer 244 may be formed over only a portion of top surface 248 of emitter 206. Since electron barrier layer 244 may be fabricated using existing BiCMOS process steps, the fabrication of electron barrier layer 244 does not require additional process steps and additional fabrication cost.

Further shown in FIG. 2, silicide layers 250 and 252 are situated on emitter contact layers 240 and 242, respectively. Silicide layers 250 and 252 provide low resistance ohmic contacts for connecting to emitter 206 via emitter contact layers 240 and 242, respectively. Silicide layers 250 and 252 can comprise, for example, tungsten silicide ("$WSi_2$"), titanium silicide ("$TiSi_2$"), or other appropriate silicide as known in the art. Also shown in FIG. 2, collectors 208 and 210 can comprise P+ type material, i.e. a heavily doped P type material, and can be formed in silicon substrate 212 in a manner known in the art.

The operation of lateral PNP transistor 202 will now be discussed. In an active mode of operation, where base-emitter junction 238 is forward biased, the gain of lateral PNP transistor 202 is determined by the equation: $\beta = i_c/i_b$, where "β" is the gain of lateral PNP transistor 202, "$i_c$" is the current flowing through collectors 208 and 210, and "$i_b$" is the current flowing through base 204. By way of background, the current flowing through base 204, i.e. "$i_b$," comprises two dominant components: a space charge recombination current that occurs as a result of base-emitter junction 238 and a diffusion current that is caused by an electron concentration gradient in emitter 206.

In the active mode, a high electron concentration exists at base-emitter junction 238 as a result of forward bias at base-emitter junction 238, dopant concentration in emitter 206, and dopant concentration in base 204. At the interface between electron barrier layer 244 and emitter 206, i.e. top surface 248 of emitter 206, electron barrier layer 244 operates as an electron diffusion barrier, which causes electrons to accumulate at top surface 248 of emitter 206. However, the electron concentration that accumulates at top surface 248 of emitter 206, i.e. the interface between emitter 206 and electron barrier layer 244, is lower than the electron concentration at base-emitter junction 238. Thus, an electron concentration gradient is formed as a result of the difference in electron concentration between base-emitter junction 238 and top surface 248 of emitter 206. The steepness of the slope of the electron concentration gradient determines the amount of electron diffusion current that flows into emitter 206.

Figure 1:
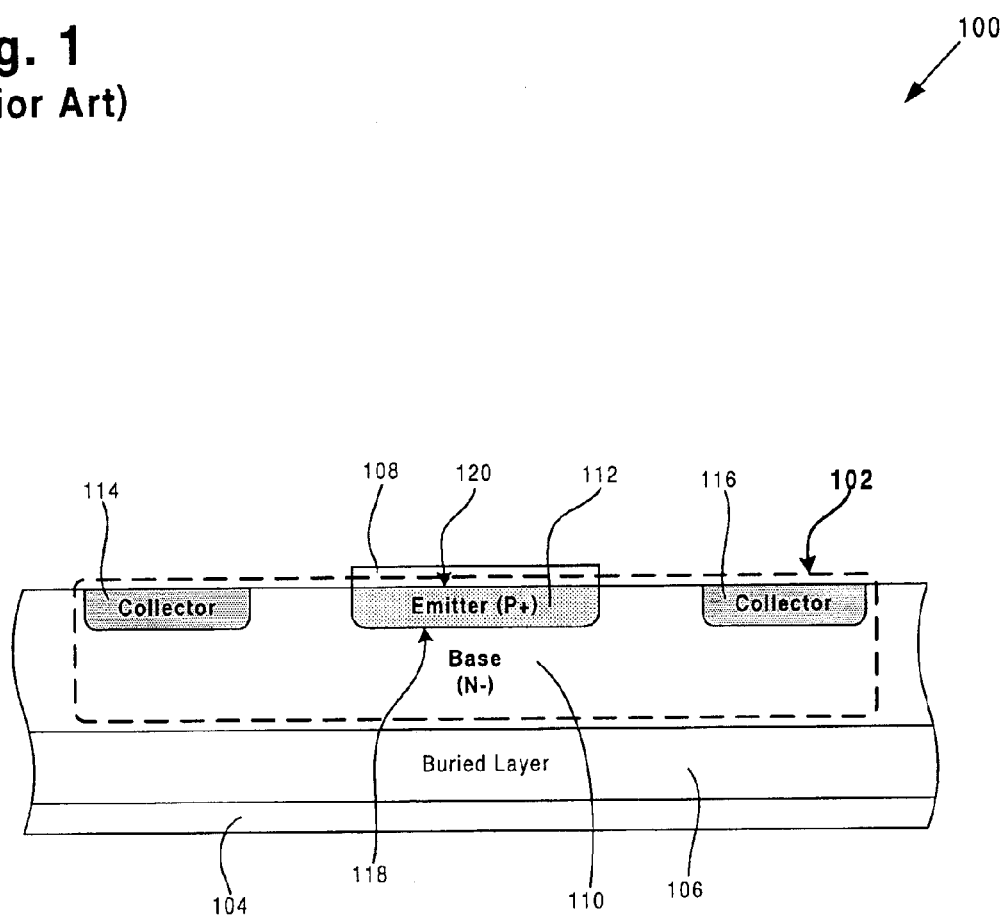
FIG. 1 illustrates a cross-sectional view of a structure utilized in the fabrication of a conventional exemplary bipolar transistor.

In contrast, in a conventional lateral PNP transistor, such as conventional lateral PNP transistor 102 in FIG. 1, the silicide layer that forms an ohmic contact on the emitter, such as silicide layer 108 in FIG. 1, causes the electron concentration to be approximately zero at interface between the silicide layer and the emitter. As a result, the slope of the electron concentration gradient in emitter 112 of conventional lateral PNP transistor 102 is much steeper than the slope of the electron concentration gradient in emitter 206. As a result, the electron diffusion current and, consequently, the base current, are much higher in conventional lateral PNP transistor 102 than in lateral PNP transistor 202. Thus, the beta, i.e. the gain, of lateral PNP transistor 202 is much higher than the beta of conventional lateral PNP transistor 102. The beta of the present invention's lateral PNP transistor 202 can be, for example, between approximately 20.0 and approximately 50.0. In contrast, the beta of a conventional lateral PNP transistor, such as conventional lateral PNP transistor 102 in FIG. 1 can be, for example, approximately 10.0.

Thus, by utilizing electron barrier layer 244 as an electron diffusion barrier to reduce base current, the present invention advantageously achieves a lateral PNP transistor having a beta approximately two to five times higher than a conventional lateral PNP transistor using a silicide layer, i.e. an ohmic contact, over an emitter. Furthermore, the present invention advantageously achieves a much higher beta than a conventional lateral PNP transistor without an undesirable increase in process steps and fabrication cost.

Figure 3:
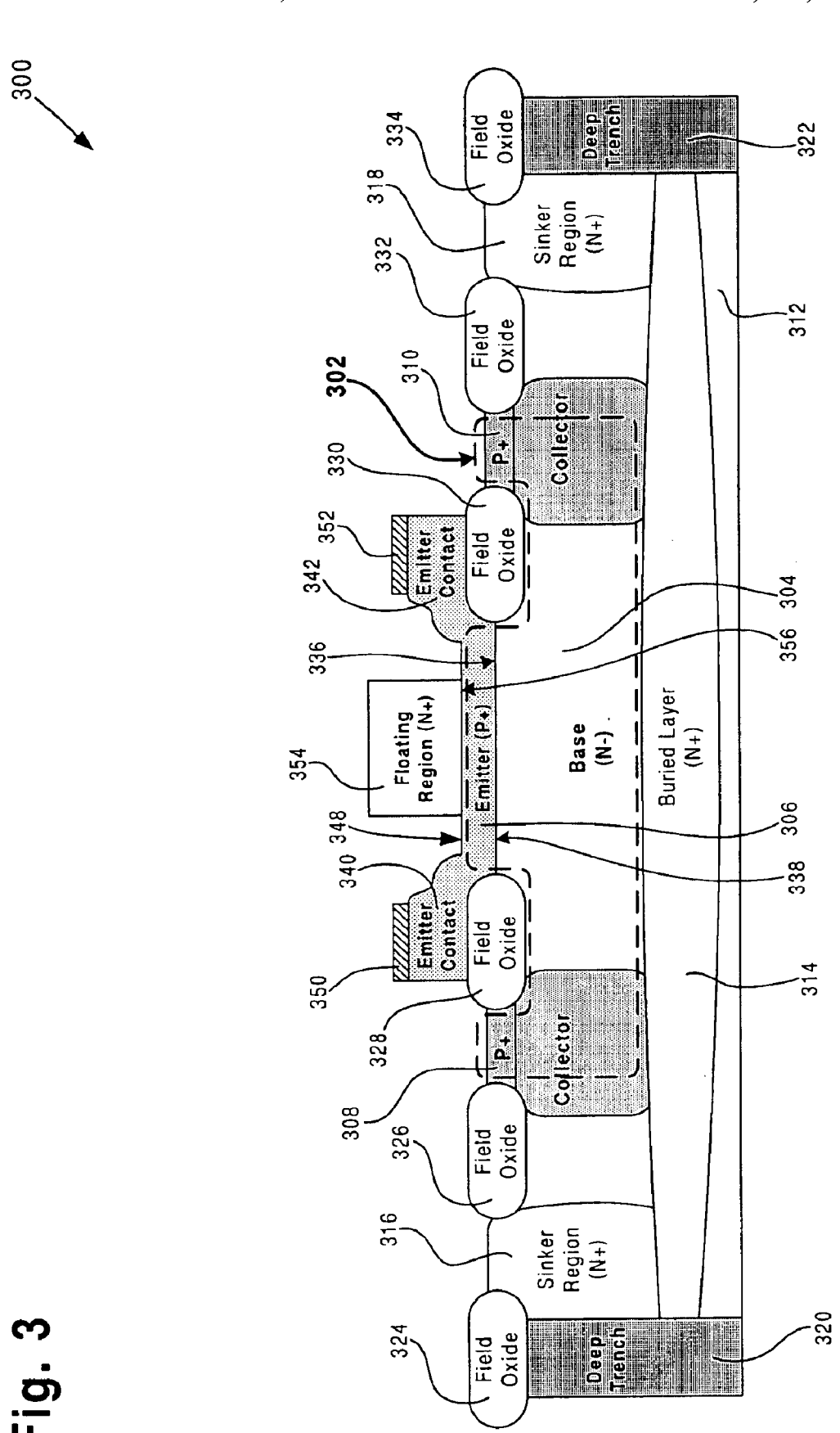
FIG. 3 illustrates a cross-sectional view of an exemplary structure utilized in the fabrication of an exemplary bipolar transistor in accordance with another embodiment of the present invention.

FIG. 3 shows a cross-sectional view of an exemplary structure that includes an exemplary lateral PNP transistor in accordance with one embodiment of the present invention. Certain details and features have been left out of FIG. 3 that are apparent to a person of ordinary skill in the art. In structure 300 in FIG. 3, base 304, emitter 306, collectors 308 and 310, substrate 312, buried layer 314, sinker regions 316 and 318, deep trenches 320 and 322, filed oxide regions 324, 326, 328, 330, 332, and 334, top surface 336, base-emitter junction 338, emitter contact layers 340 and 342, top surface 348, and silicide layers 350 and 352 correspond, respectively, to base 204, emitter 206, collectors 208 and 210, substrate 212, buried layer 214, sinker regions 216 and 218, deep trenches 220 and 222, filed oxide regions 224, 226, 228, 230, 232, and 234, top surface 236, base-emitter junction 238, emitter contact layers 240 and 242, top surface 248, and silicide layers 250 and 252 in structure 200 in FIG. 2. To preserve brevity, only the differences between the embodiment of the present invention shown in FIG. 3 and the embodiment of the present invention shown in FIG. 2 are discussed below.

As shown in FIG. 3, floating N+ region 354 is situated on top surface 348 of emitter 306. Floating N+ region 354 can comprise N+ type polysilicon, which may be formed, for example, by depositing polysilicon and doping the polysilicon with an appropriate dopant while the polysilicon is being deposited in a CVD process. Floating N+ region 354 can be deposited in the same process step as emitter 306 and, as a result, floating N+ region 354 does not require additional process steps and fabrication cost. Floating N+ region 354 is not driven and, as such, the voltage of floating N+ region 354 is unknown. Floating N+ region 354 forms a PN junction at interface 356, where floating N+ region 354 contacts emitter 306. In one embodiment, floating N+ region 354 can include a dielectric spacer situated within each of two corner sections of floating N+ region 354, wherein floating N+ region 354 is situated on emitter 306 such that the dielectric spacers are in contact with top surface 348 of emitter 306. In such embodiment, the dielectric spacers can comprise silicon oxide or other appropriate dielectric material.

The operation of lateral PNP transistor 302 will now be discussed. Similar to the operation of lateral PNP transistor 202 discussed above, in an active mode, current flowing through base 304 comprises two dominant components: a space charge recombination current that occurs as a result of base-emitter junction 338 and a diffusion current that is caused by an electron concentration gradient in emitter 306. As discussed above, in the active mode, a high electron concentration exists at base-emitter junction 338 as a result of forward bias at base-emitter junction 338, dopant concentration in emitter 306, and dopant concentration in base 304.

In the active mode, N+ region 354 functions as an electron diffusion barrier to cause a high concentration of electrons to accumulate at interface 356. However, the electron concentration that accumulates at interface 356 is lower than the electron concentration at base-emitter junction 338. Thus, an electron concentration gradient is formed in emitter 306 as a result of the difference in electron concentration between base-emitter junction 338 and interface 356. The steepness of the slope of the electron concentration gradient determines the amount of electron diffusion current that flows into emitter 306.

Similar to the comparison between lateral PNP transistor 202 and a conventional lateral PNP transistor discussed above, the slope of an electron concentration gradient in the emitter of a conventional lateral PNP transistor is much steeper than the slope of an electron concentration gradient in emitter 306 of lateral PNP transistor 302. As a result, the electron diffusion current and, consequently, the base current, are much higher in a conventional lateral PNP transistor, such as conventional lateral PNP transistor 102 in FIG. 1. Thus, similar to lateral PNP transistor 202 in FIG. 2, the beta, i.e. the gain, of lateral PNP transistor 302 is also much higher than the beta of conventional lateral PNP transistor 102 in FIG. 1. Similar to the beta achieved by lateral PNP transistor 202, the beta of lateral PNP transistor 302 can also be between approximately 20.0 and approximately 50.0, which is much higher than the beta of approximately 10.0 typically achieved by a conventional lateral PNP transistor, such as conventional lateral PNP transistor 102.

Thus, by utilizing floating N+ region 354 as an electron diffusion barrier to reduce base current, the present invention advantageously achieves a lateral PNP transistor having a beta approximately two to five times higher compared to a conventional lateral PNP transistor using a silicide layer, i.e. an ohmic contact, over an emitter. Furthermore, similar to lateral PNP transistor 202 discussed above, the present invention's lateral PNP transistor 302 also advantageously achieves a much higher beta compared to a conventional lateral PNP transistor without suffering an undesirable increase in process steps and fabrication cost.

Figure 4:
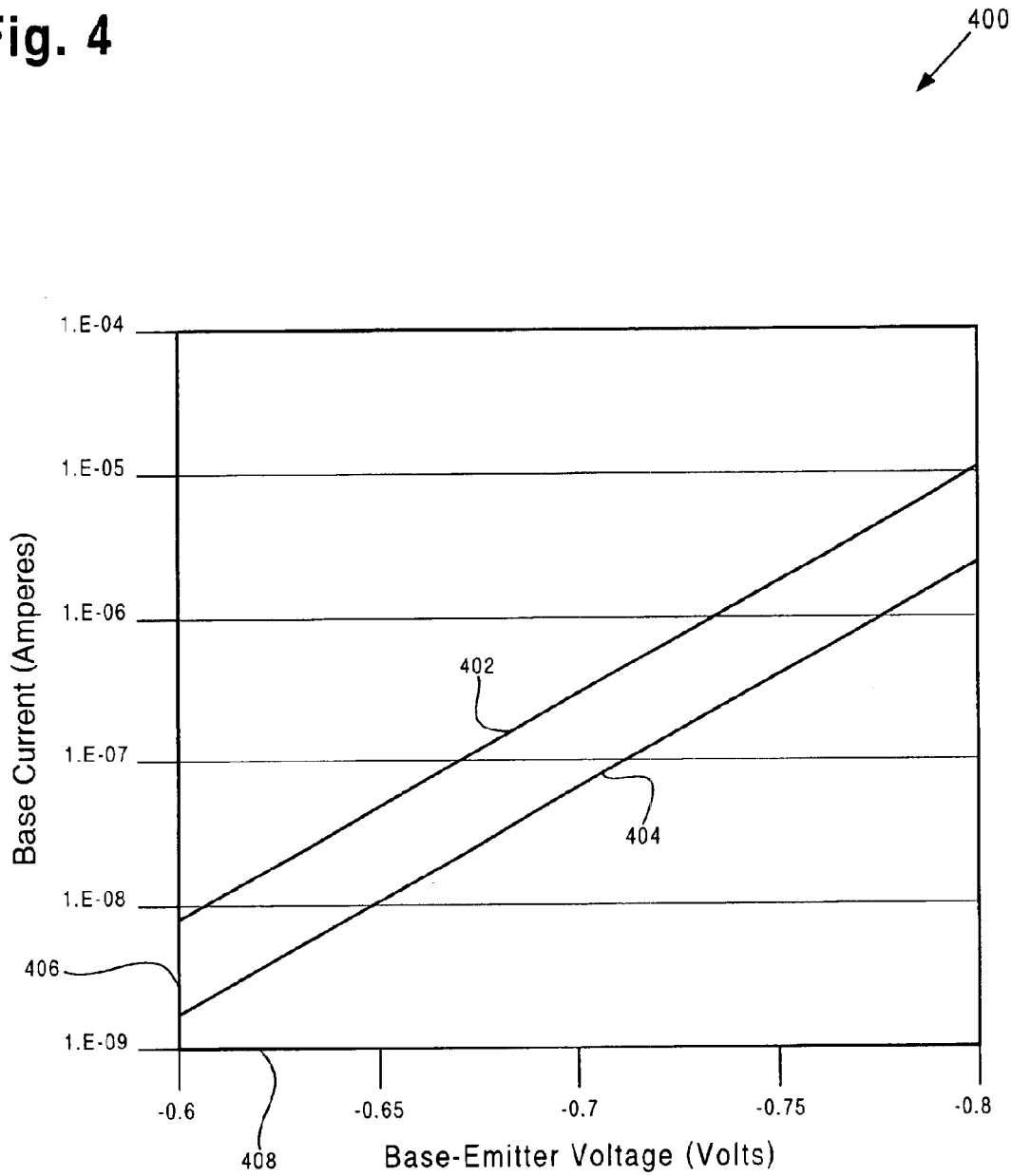
FIG. 4 is a graph comparing the base current in the conventional exemplary bipolar transistor of FIG. 1 to the base current in the bipolar transistors of FIGS. 2 and 3 in accordance with the two exemplary embodiments of the present invention.

FIG. 4 shows a graphical comparison of base current in conventional lateral PNP transistor 102 in FIG. 1 versus base current in lateral PNP transistor 202 or 302 in FIGS. 2 and 3 in accordance with two embodiments of the present invention. As shown in graph 400, line 402 represents base current in conventional lateral PNP transistor 102 in FIG. 1 and line 404 represents base current in lateral PNP transistor 202 or 302 of the present invention. Also shown in graph 400, base current axis 406, which shows base current in amperes, is plotted against base-emitter voltage axis 408, which shows base-emitter voltage in volts.

Thus, as shown in graph 400, the present invention's lateral PNP transistors 202 and 302 advantageously achieve a base current that is lower than the base current in conventional lateral PNP transistor 102 by a factor of approximately five. As a result, the various embodiments of the present invention's lateral PNP transistor advantageously achieve a beta that is approximately five times higher compared to the beta achieved in conventional lateral PNP transistor 102.

In one embodiment, instead of utilizing field oxide that is used in lateral PNP transistors 202 and 302 to define the emitter and collector regions, gate oxide formed during fabrication of PMOS transistors can be utilized to define the emitter and collector of the present invention's lateral PNP transistor. In such embodiment, the emitter and collector of the present invention's lateral PNP transistor can be formed by the same implant or diffusion process utilized to form the source and drain of PMOS transistors. In that embodiment, increased beta can be advantageously achieved by utilizing either electron barrier layer 244 as discussed above in lateral PNP transistor 202 in FIG. 2 or by utilizing floating N+ region 354 as discussed above in lateral PNP transistor 302 in FIG. 3.

It is appreciated by the above detailed description that the present invention achieves increased beta in a lateral PNP transistor without requiring additional process steps or increased fabrication cost. From the above description of the invention it is manifest that various techniques can be used for implementing the concepts of the present invention without departing from its scope. Moreover, while the invention has been described with specific reference to certain embodiments, a person of ordinary skills in the art would appreciate that changes can be made in form and detail without departing from the spirit and the scope of the invention. For example, it is appreciated that materials other than SiGe can be utilized in the formation of the invention's lateral PNP transistor. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a high gain bipolar transistor has been described.

What is claimed is:

1. A bipolar transistor comprising:
   a base having a top surface;
   an emitter having a top surface, said emitter being situated on said top surface of said base;
   an electron barrier layer situated directly on said top surface of said emitter in an opening defined by a plurality of emitter contact layers and said top surface of said emitter, said electron barrier layer causing a base current in said base to decrease;
   wherein said emitter separates said electron barrier layer from said base.

2. The bipolar transistor of claim 1 wherein said bipolar transistor is a PNP bipolar transistor.

3. The bipolar transistor of claim 1 wherein said bipolar transistor is a lateral PNP bipolar transistor.

4. The bipolar transistor of claim 1 wherein said electron barrier layer comprises a dielectric.

5. The bipolar transistor of claim 4 wherein said dielectric comprises silicon oxide.

6. The bipolar transistor of claim 1 wherein said electron barrier layer causes an increase in a beta of said bipolar transistor.

7. The bipolar transistor of claim 1 wherein said base comprises N type single crystal silicon.

8. The bipolar transistor of claim 1 wherein said emitter comprises P+ type single crystal silicon-germanium.

9. A PNP bipolar transistor comprising:
   a base having a top surface;
   an emitter having a top surface, said emitter being situated on said top surface of said base;
   a floating N+ region situated directly on said top surface of said emitter in an opening defined by a plurality of emitter contact layers and said top surface of said emitter, said floating N+ region causing a base current in said base to decrease.

10. The PNP bipolar transistor of claim 9 wherein said PNP bipolar transistor is a lateral PNP bipolar transistor.

11. The PNP bipolar transistor of claim 9 wherein said floating N+ region comprises N+ type polysilicon.

12. The PNP bipolar transistor of claim 9 wherein said floating N+ region causes an increase in a beta of said bipolar transistor.

13. The PNP bipolar transistor of claim 9 wherein said base comprises N type single crystal silicon.

14. The PNP bipolar transistor of claim 9 wherein said emitter comprises P+ type single crystal silicon-germanium.

15. The PNP bipolar transistor of claim 9 wherein said floating N+ region comprises a dielectric spacer situated adjacent to said floating N+ region, said dielectric spacer being in contact with said top surface of said emitter.

* * * * *